(12) United States Patent
Giery

(10) Patent No.: US 11,672,333 B2
(45) Date of Patent: Jun. 13, 2023

(54) FLIP TOP TABLE WITH A NESTED LEG ASSEMBLY

(71) Applicant: Ronald Giery, Manhattan Beach, CA (US)

(72) Inventor: Ronald Giery, Manhattan Beach, CA (US)

( * ) Notice: Subject to any disclaimer, the term of this patent is extended or adjusted under 35 U.S.C. 154(b) by 0 days.

(21) Appl. No.: 17/470,256

(22) Filed: Sep. 9, 2021

(65) Prior Publication Data

US 2022/0071384 A1 Mar. 10, 2022

Related U.S. Application Data

(60) Provisional application No. 63/075,941, filed on Sep. 9, 2020.

(51) Int. Cl.
*A47B 3/08* (2006.01)

(52) U.S. Cl.
CPC .... *A47B 3/0818* (2013.01); *A47B 2003/0806* (2013.01)

(58) Field of Classification Search
CPC ..... A47B 3/0818; A47B 3/0803; A47B 3/083; A47B 2003/0806; A47B 2200/0036
See application file for complete search history.

(56) References Cited

U.S. PATENT DOCUMENTS

| | | | | |
|---|---|---|---|---|
| 4,643,105 A * | 2/1987 | Baum | ................... | A47B 3/0818 108/4 |
| 4,773,337 A * | 9/1988 | Ball | ..................... | A47B 13/023 108/150 |
| 5,398,620 A | 3/1995 | Rouch | | |
| 5,562,052 A | 10/1996 | Glashouwer et al. | | |
| 5,638,761 A | 6/1997 | Berkowitz et al. | | |
| 5,927,214 A | 7/1999 | Schwartz et al. | | |
| 6,041,721 A | 3/2000 | Weston | | |
| 6,082,838 A | 7/2000 | Bissu-Palombo | | |
| 6,170,407 B1 | 1/2001 | Hayward | | |
| 6,314,892 B1 | 11/2001 | Favini | | |
| 6,336,414 B1 | 1/2002 | Stewart et al. | | |
| 6,637,352 B1 * | 10/2003 | Thode | ...................... | A47B 3/08 108/115 |
| 6,647,900 B1 | 11/2003 | Kopish | | |
| 6,845,723 B2 | 1/2005 | Kottman et al. | | |
| 6,997,115 B2 | 2/2006 | Lockwood et al. | | |

(Continued)

*Primary Examiner* — Daniel J Rohrhoff
(74) *Attorney, Agent, or Firm* — Fitzpatrick PC

(57) ABSTRACT

A flip top table with a nesting leg assembly is disclosed. The flip top table has a primary shaft having a top portion, a bottom supporting plate secured to the top portion of the primary shaft, a hinge assembly connected to a side of the bottom supporting plate, a top supporting plate coupled to the bottom supporting plate via the hinge assembly, wherein the top supporting plate is configured to receive and secure a tabletop, a locking knob operatively positioned at a bottom portion the bottom supporting plate, wherein the locking knob has a threaded portion is configured to secure the bottom supporting plate to the top supporting plate, wherein a counter force from the hinge assembly is configured to dampen a closing weight of the top supporting plate and the top supporting plate has an insert configured to receive the threads of the locking knob to lock the top supporting plate to the bottom supporting plate in a horizontal position.

14 Claims, 11 Drawing Sheets

(56) References Cited

U.S. PATENT DOCUMENTS

| | | | |
|---|---|---|---|
| 7,066,098 B2 * | 6/2006 | Blasen | A47B 7/02 |
| | | | 108/115 |
| 7,634,968 B2 * | 12/2009 | Cornelius | A47B 3/0803 |
| | | | 108/115 |
| 7,765,938 B2 | 8/2010 | Piretti | |
| 8,069,795 B1 | 12/2011 | Williams et al. | |
| 8,359,983 B2 | 1/2013 | Williamson et al. | |
| 9,980,559 B2 | 5/2018 | Randolph et al. | |
| D819,998 S | 6/2018 | Siebert et al. | |
| 10,051,960 B1 | 8/2018 | Siebert et al. | |
| 10,295,311 B1 | 5/2019 | Trubacek et al. | |
| 10,390,611 B2 | 8/2019 | Lee | |
| 10,413,063 B2 | 9/2019 | Lee | |
| 10,595,630 B2 | 3/2020 | Lam et al. | |
| 10,758,038 B2 | 9/2020 | Ruzicka et al. | |
| 10,866,068 B1 | 12/2020 | Trubacek et al. | |
| 11,033,101 B2 | 6/2021 | Bonato et al. | |
| 11,229,284 B1 * | 1/2022 | Trubacek | A47B 13/06 |
| 2006/0230991 A1 * | 10/2006 | Piretti | A47B 3/0803 |
| | | | 108/115 |
| 2007/0137534 A1 | 6/2007 | Dhanoa | |
| 2009/0114130 A1 * | 5/2009 | Chirea | A47B 7/02 |
| | | | 108/124 |
| 2011/0017107 A1 * | 1/2011 | Ko | A47B 3/0818 |
| | | | 108/115 |
| 2014/0140788 A1 * | 5/2014 | Frodis, III | F16B 33/02 |
| | | | 411/436 |
| 2016/0324309 A1 * | 11/2016 | Kassanoff | A47B 3/0818 |
| 2019/0307242 A1 * | 10/2019 | Payne | A47B 17/036 |
| 2020/0367639 A1 * | 11/2020 | Bonato | A47B 3/0803 |
| 2021/0068530 A1 * | 3/2021 | Tao | A47B 3/0818 |
| 2022/0015536 A1 * | 1/2022 | Conway | A47B 3/083 |

* cited by examiner

FLIP TOP TABLE WITH A NESTED LEG ASSEMBLY

CROSS-REFERENCE TO RELATED APPLICATION

This application claims the benefit of U.S. Provisional Patent Application Ser. No. 63/075,941 filed Sep. 9, 2020 entitled Flip Top Table with Nested Leg Assembly, the entire contents of which are incorporated by reference herein for all purposes.

FIELD OF THE INVENTION

The present invention generally relates to tables. More specifically, the present invention relates to a flip top table having a rotation mechanism and a nesting leg assembly.

BACKGROUND

A table is an item of furniture with a flat top and one or more legs, used as a surface for working at, eating from or on which to place things. Many different types of tables are well known and used for a variety of different purposes. For example, conventional tables may include legs that are pivotally attached to a table top and the legs may be movable between a use position in which the legs extend outwardly from the table top and a storage position in which the legs are folded against the table top.

Conventional tables, namely, relatively large tabletops and folding legs are frequently used in assembly halls, banquet halls, convention centers, hotels, schools, churches and other locations where large groups of people meet. These types of tables can often be positioned in an assortment of different configurations and used in a variety of settings. When tables are no longer needed, the table legs can be moved into the storage position and the tables may be more easily moved or stored. The required storage area for such tables is quite large even with the legs in the collapsed position. This large storage area may be problematic for businesses or facilities such as hotels, schools and churches because a considerable number of these tables may have to be stored. The large size of conventional tables may also be problematic for manufacturers, retailers and consumers because a number of tables may have to be stored, transported and/or displayed. Lastly, some of the tables may too heavy and thus dangerous to for the user to turn over to adjust the legs.

Further, due to the global pandemic (e.g., COVID-19), governments are instituting measures in which only outdoor dining is allowed. This means that restaurant owner must constantly move tables around and move them in and out of storage.

In light of the above-mentioned problems, there is a need for a flip top table having a rotating mechanism and a nesting or nested leg assembly.

SUMMARY OF THE INVENTION

The present invention generally discloses tables. Further, the present invention discloses a flip top table having a flip mechanism and a nesting leg assembly, wherein the top of the table is configured to fold upward axially and one pair of legs of the table nets within other pair of legs of adjacent tables. Further, the present invention is related to a flip top and nested legs assembly for a table that has stabilization elements in its legs that automatically adjust to prevent the table from rocking on uneven surfaces.

In one embodiment, the flip top table comprises a rotating mechanism and a nested (or nesting) leg assembly. In one embodiment, the flip top table comprises a frame having a tension spring pivoting assembly (e.g., rotating assembly) having a hinge, and a nesting leg assembly. In one embodiment, the hinge assembly is configured to enable the user to position a tabletop axially upward, and the nested leg assembly is configured to enable a pair of legs of the table so that they nest within other pair of legs of adjacent tables, thereby enabling the user to easily fold and stored and also deployed only when needed. The flip top table requires less place for storing and makes for easier transporting. In one embodiment, one or more flip top tables are frequently used in, but not limited to, assembly halls, banquet halls, convention centers, hotels, schools, churches and other locations where large groups of people meet in places where tables need to be moved in and out.

In on embodiment, the flip top table comprises a primary shaft having a top portion, a bottom supporting plate secured to the top portion of the primary shaft, a hinge assembly connected to a side of the bottom supporting plate, a top supporting plate coupled to the bottom supporting plate via the hinge assembly, wherein the top supporting plate is configured to receive and secure a tabletop, a locking knob operatively positioned at a bottom portion the bottom supporting plate, wherein the locking knob has a threaded portion is configured to secure the bottom supporting plate to the top supporting plate, wherein a counter force from the hinge assembly is configured to dampen a closing weight of the top supporting plate and a nesting leg assembly securely affixed to a bottom portion of the primary shaft, wherein the nesting leg assembly comprises a pair of nesting legs configured to enable a user to deploy or position the tabletop upwardly and store the tables in a nesting configuration, wherein the top supporting plate comprises an insert configured to receive the threads of the locking knob to lock the top supporting plate to the bottom supporting plate in a horizontal position.

In one embodiment, the frame comprises a vertical shaft or a primary shaft and a pair of nested legs which are securely and adjustably connected to the bottom of the primary shaft using a locking knob with steel threads, although other locking mechanisms may be employed. In one embodiment, a horizontal or bottom steel supporting plate is securely affixed to the top of the primary shaft and a vertical or top supporting plate is hingedly and movably affixed to the bottom supporting plate using the hinge assembly via offset mounting or hinge tubes. In one embodiment, a locking knob or other locking mechanism is operatively positioned at a bottom portion of one end of the bottom supporting plate. The locking knob is configured to secure the bottom supporting plate for horizontally positioning the tabletop, thereby supporting user items such as, but not limited to, food and beverages, laptops, writing and/or drawing equipment, and the like. In one embodiment, at least one or more hangers or hooks are secured at sides of the primary shaft. In one embodiment, the nesting leg configuration is composed of two sets of legs, one set made to fit under the other set of legs when attached to the table base.

In one embodiment, the hinge assembly is configured to exert force for holding the top supporting plate in the open position or upward axially, thereby enabling the user to place or position the pair of nested legs nets within other pair of legs of adjacent tables. The counter force acts against the closing weight of the tabletop. In one embodiment, the top supporting plate further comprises a threaded insert or bushing which is configured to receive the threads of the locking knob in order to lock the top supporting plate and the bottom supporting plate together in the horizontal or closed position. The bottom supporting plate is provided for the attachment of a table base leg assemble and the top supporting plate is provided for the attachment of a table top. When the bottom and top supporting plates are held in position by the pins, they provide a solid and secure connection between the table base and the tabletop.

In one embodiment, spacers provide a precise height that separate the top supporting plate and the bottom supporting plate when the top supporting plate is in the horizontal or in a closed position. The spacers are attached (e.g., welded) to the bottom supporting plate. The spacers keep the top supporting plate and the bottom supporting plate in a parallel relationship.

In one embodiment, the bottom supporting plate is secured to the primary shaft. In some embodiments, the bottom supporting plate is coupled to the primary shaft. In one embodiment, the bottom supporting plate further comprises hinge tubes in order to receive the top supporting plate along with the hinge assembly. In one embodiment, the bottom supporting plate further comprises cutouts on both sides for hand holds to facilitate moving of the table. In one embodiment, the locking knob with steel threads further comprises a clip, for example, an e-clip. In one embodiment, the clip is secured to the threads to support and keep the bottom supporting plate and the top supporting plate in a secured parallel position when the assemble is in the closed or horizontal and locked position.

In one embodiment, the top supporting plate is configured to receive and secure the tabletop. The tabletop is secured to the top supporting plate using one or more fasteners, for example, bolts and nuts. In one embodiment, the top supporting plate further comprises a long bushing or a holder for receiving the tension spring pivoting assemble or flip mechanism or a hinge assembly. In one embodiment, the long bushing or a holder is welded to one end of the top supporting plate.

In one embodiment, the bottom supporting plate having the hinge tubes are secured or welded to one end of the bottom supporting plate for receiving the hinge assembly. In one embodiment, hinge assembly is provided with an internal spring in order to exert force for holding the top supporting plate 106 in the open position or axially upward position.

In one embodiment, the locking knob enables the user to lock both bottom supporting plate and the top supporting plate together in a secured parallel position. All tolerance is kept to approximately zero in this configuration. In one embodiment, the hinge assembly must tolerances must be held to −0.005 to +0.005 for securing the bottom supporting plate and the top supporting plate together in the horizontal rotational plane. In this way, the tabletop cannot rotate in the horizontal plane or vertices plane, as this may be perceived by the user as being unstable. The user could lock the lock both bottom supporting plate and the top supporting plate together in a secured parallel position using the locking knob. The locking knob with steel threads applies the necessary force to securely keep the bottom supporting plate and the top supporting plate together. The threaded insert or steel threaded bushing could receive the steel threads of the locking knob in order to lock the top supporting plate and the horizontal supporting plate together in the horizontal or closed position.

In one embodiment, the tables are capable of nesting in a minimum length to conserve space and permit storage of a large number of tables in a given storage space. In this way, the user could easily deploy or position the tabletop upwardly and store the tables in a nesting configuration. This eliminate the problems and risks associated with stacking of several tables. In one embodiment, the nesting position allows approximately 4x-6x tables per 12 square feet.

In another embodiment, the table further comprises two pair of nested legs i.e., a first pair of nesting legs and a second pair of nesting legs, which are adjustably and securely connected using the locking knob with steel threads. In one embodiment, the first pair of nesting legs and second pair of nesting legs could support the tabletop or top board when it is used at a working position or a use position.

In another embodiment, the first pair of nesting legs and second pair of nesting legs are configured to enable the user to position and store the tables in a nesting configuration within a minimum length to conserve space and permit storage of a large number of tables in a given storage space. The user may easily deploy or position the tabletop upwardly and store the tables in a nesting configuration.

In one embodiment, the hinge assembly is provided with the internal spring and pins or pivot pins on both sides of the hinge assembly, and three steel bushings. In one embodiment, the pivot pins are configured to provide precision locating function for the three steel bushings and provide a bearing surface for the rotation of the steel bushings. Further, the pivot pins are configured to provide a secure slot for the capture of the internal spring or tension spring. When the pivot pins are inserted into the bushings, the bottom and top supporting plates can rotate independent of each other but maintain a precise relationship, whether in the open, vertical position, or closed in the horizontal position.

In one embodiment, the hinge assembly further comprises at least two roll pins, which are configured to provide a simple method to lock the pivot pins a position relative to the steel busing. The roll pin locks the steel pin in relation to the long bushing, which is attached to the top supporting plate. The second roll pin locks the other steel pin in relation to one of the short bushings, which is attached to the bottom supporting plate. This pin is also used to adjust the tension on the internal spring. In the end of the steel pin is a hex pattern to insert a tool to apply and adjust the tension on the internal spring. When the correct tension is obtained, by rotating the steel pin, the roll pin is inserted through matching holes in the bushing and steel pin to lock the steel pin in place.

The internal spring exerts force for holding the top supporting plate in the open position or upward axially position. When the top supporting plate attached to the tabletop, it will move from the open or vertical position to the horizontal or closed position where the internal spring is put under tension. The loading of the internal spring provides a countering force to the closing force or weight of the tabletop. This force aids to reduce the quick and uncontrolled closing of the tabletop assemble. In one embodiment, the user could adjust the force and load the rotating spring force for the opening force using a hex key via hex key openings at both ends, thereby counteracting closing weight of the tabletop.

The locking knob is operatively positioned at a bottom portion of one end of the bottom supporting plate. In one embodiment, the locking knob at the bottom portion is configured to secure the top supporting plate for horizontally positioning the tabletop, thereby supporting user items such as, but not limited to, a laptop, a computer, writing and/or drawing equipment, food, beverages, and so forth.

The locking knob provides a clamping force that holds the top supporting plate and the bottom supporting plate in a closed or horizontal position. The locking knob has a male thread and is inserted through a hole in the bottom supporting plate. The steel threaded insert or bushing has female threads and is attached (welded) to the top supporting plate. When the top supporting plate is closed, the locking knob's male thread is inserted into the female thread of the steel threaded insert or bushing the locking knob is turned and the resulting clamping force is applied, and the bottom and top supporting plates are held in a secure position.

In one embodiment, the clip, for example, e-clip, is secured to the threads to support and keep the bottom supporting plate and the top supporting plate in a secured parallel position when the assemble is in the closed or horizontal and locked position. The clip, when inserted in a groove in the male threads of the locking knob, ensures that the locking knob will not fall out of its hole in the bottom supporting plate. The hole in the bottom supporting plate is larger than the diameter of the male threads and does not have a female thread. Thus, the locking knob is free to turn in the bottom supporting plate. In one embodiment, the clip is a made of, but not limited to, spring steel and snaps into the groove in the male threads. The inside dimension of the clip is smaller than the outside diameter of the groove. This provides for a resistance fit so that the clip will stay in place.

In one embodiment, when attached to a table base, the flip top table allows for 90+ degrees rotation of the attached tabletop, along with the offset nesting leg configuration for facilitating the closer storage of multiple table bases with attached tabletops. The tension spring pivoting assemble and offset mounting of the flip top table helps maintain the tabletop in the vertical plane and assists in the smooth and safe transition to the horizontal plane. The flip mechanism and nesting leg configuration together allow for the storage of four to six times more tables in the same space, compared to a standard table base tabletop configuration. The tension spring allows for a very simple means of controlling the tabletop in the correct position for storage and the safe transition to the horizontal position. In one embodiment, the flip top table could be used on a table base without the use of the nesting legs.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

BRIEF DESCRIPTION OF DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and structures disclosed herein. The description of a method step or a structure referenced by a numeral in a drawing is applicable to the description of that method step or structure shown by that same numeral in any subsequent drawing herein.

DETAILED DESCRIPTION OF EMBODIMENTS

Figure 1:
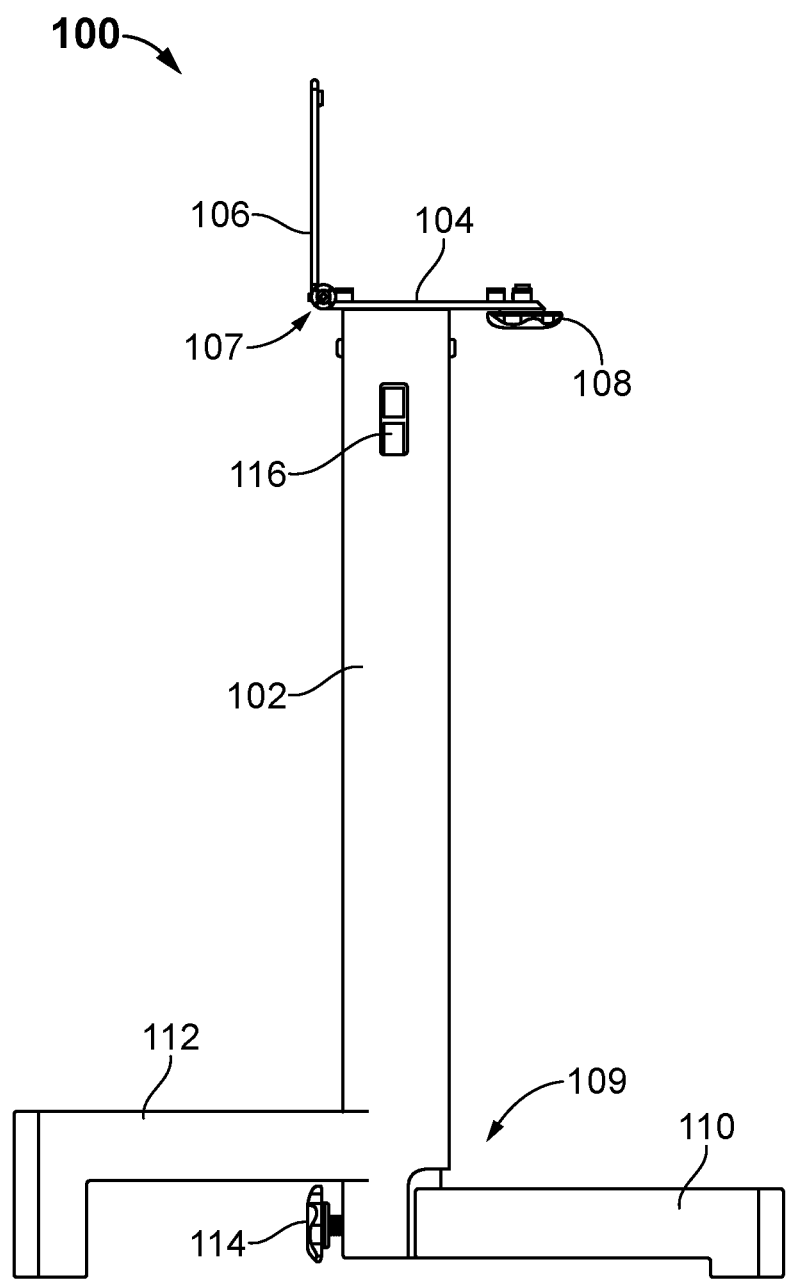
FIG. 1 shows a side view of a flip top table having a flip mechanism and a nesting leg assembly in an embodiment of the present invention.

The present invention is best understood by reference to the detailed figures and description set forth herein.

Embodiments of the system are discussed below with reference to the examples. However, those skilled in the art will readily appreciate that the detailed description given herein with respect to these examples is for explanatory purposes as the system extends beyond these limited embodiments. For example, it should be appreciated that those skilled in the art will, in light of the teachings of the present system, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the system that are too numerous to be listed but that all fit within the scope of the system. Also, singular words should be read as plural and vice versa and masculine as feminine and vice versa, where appropriate, and alternative embodiments do not necessarily imply that the two are mutually exclusive.

It is to be further understood that the present system is not limited to the particular methodology, compounds, materials, manufacturing techniques, uses, and applications, described herein, as these may vary. It is also to be understood that the terminology used herein is used for the purpose of describing particular embodiments only and is not intended to limit the scope of the present system. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this system belongs. Preferred methods, techniques, devices, and materials are described, although any methods, techniques, devices, or materials similar or equivalent to those described herein may be used in the practice or testing of the present system.

It is expected that the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

Referring now to FIG. 1, a flip top table 100 in one embodiment is disclosed. The flip top table 100 comprises a primary shaft 102 and a supporting plate 104 that is coupled to the flip/rotating mechanism. In one embodiment, the flip top table 100 comprises a tension spring pivoting assembly or a flip mechanism or a hinge assembly 107 and a nesting leg assembly 109. In one embodiment, the hinge assembly 107 is configured to enable the user to position a tabletop 118 (shown in FIG. 9) upwardly axially, and the nesting leg assembly 109 is configured to enable a pair of nested legs 110 and 112 of the flip top table 100 nests within other pairs of legs of adjacent tables, thereby enabling the user to easily fold and store and also deployed only when needed. In this way, the flip top table 100 requires less space for storing and transporting.

In one embodiment, the flip top table 100 comprises a vertical shaft or a primary shaft 102 and a pair of nested legs 110 and 112, which are securely and adjustably connected to the bottom of the primary shaft 102 using a threaded locking knob 114, though other types of locking mechanism may be used (e.g., quick release lock). In one embodiment, a horizontal or bottom supporting plate 104 is securely affixed to the top of the primary shaft 102 and a vertical or top supporting plate 106 is hingedly and movably affixed to the bottom supporting plate 104 using the hinge assembly 107 via offset mounting or hinge tubes 302 and 304 (shown in FIG. 3). In one embodiment, the locking knob 108 is operatively positioned at a bottom portion of one end of the bottom supporting plate 104. The locking knob 108 is configured to secure the bottom supporting plate 104 for horizontally positioning the tabletop 118, thereby supporting user items such as, but not limited to, a laptop, a computer, writing and/or drawing equipment, food, beverages, and so forth. In one embodiment, at least one or more hangers or hooks 116 are secured at sides of the primary shaft 102. In one embodiment, the nesting leg configuration is composed of two sets of manufactured legs. One set made to fit under the other set of legs when attached to the table base.

Figure 2:
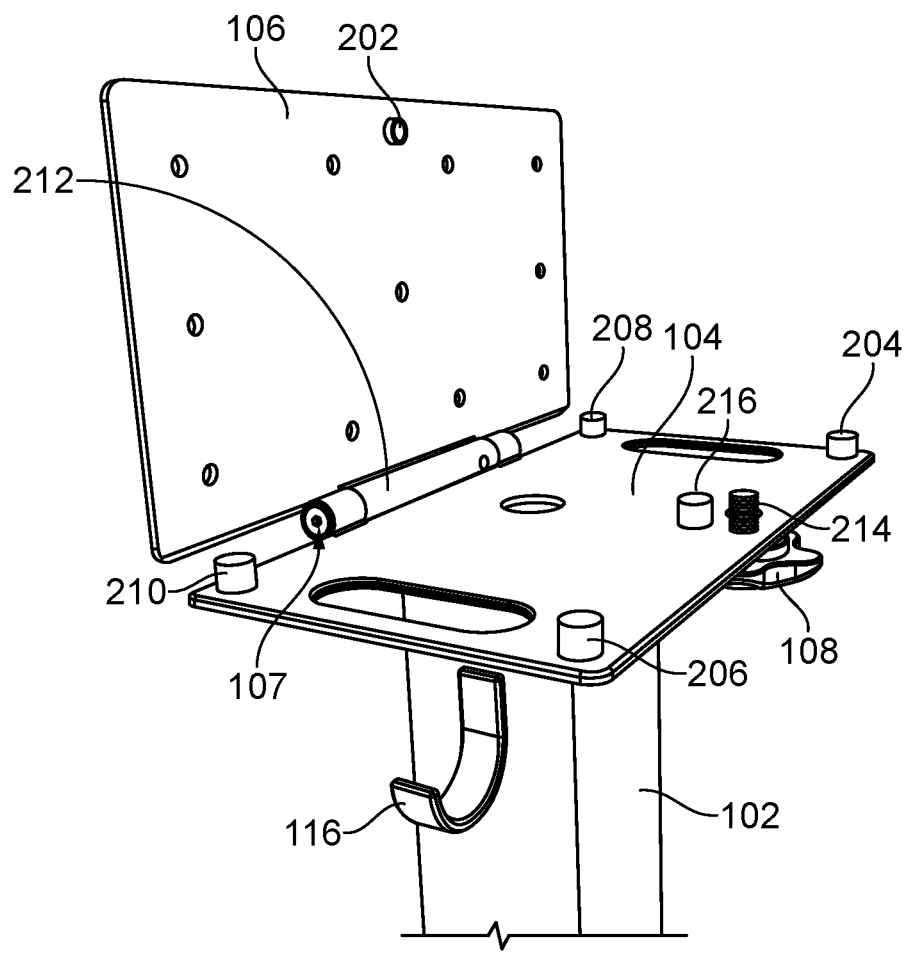
FIG. 2 shows a perspective view of the flip top table in an open position in one embodiment of the present invention.

Referring now to FIG. 2, a perspective view of the flip top table 100 in an open position in one embodiment is disclosed. In one embodiment, the hinge assembly 107 is configured to exert force for holding the top supporting plate 106 in the open position or axially upward to minimize table top square footage, thereby enabling the user to place or position the pair of nesting legs (110 and 112) nests within other pair of legs of adjacent tables. The counter force from the hinge 107, which rests inside of hinge sheath 212, acts to connect the hinge to supporting plates 104 and 106 and dampens the closing weight of the tabletop 118. In one embodiment, the top supporting plate 106 further comprises a threaded insert or bushing 202, which is configured to receive the threads 214 of the locking knob 108 in order to lock the top supporting plate 106 and the bottom supporting plate 104 together in the horizontal or closed position. Other locking mechanism may be used other than threaded bodies (e.g., pop lock mechanism). The bottom supporting plate 104 is provided for the attachment of a table base leg assemble and the top supporting plate 106 is provided for the attachment of a tabletop 118. When the bottom and top supporting plates (104 and 106) are held in position by the steel pins, they provide a solid and secure connection between the table base and the tabletop 118.

In one embodiment, spacers 204, 206, 208, 210 and 216 provide a precise height that separate the top supporting plate 106 and the bottom supporting plate 104, when the top supporting plate 106 is in the horizontal or closed position. The spacers may be attached (welded) to the bottom supporting plate 104 and keep the top supporting plate 106 and the bottom supporting plate 104 in a parallel relationship.

Figure 3:
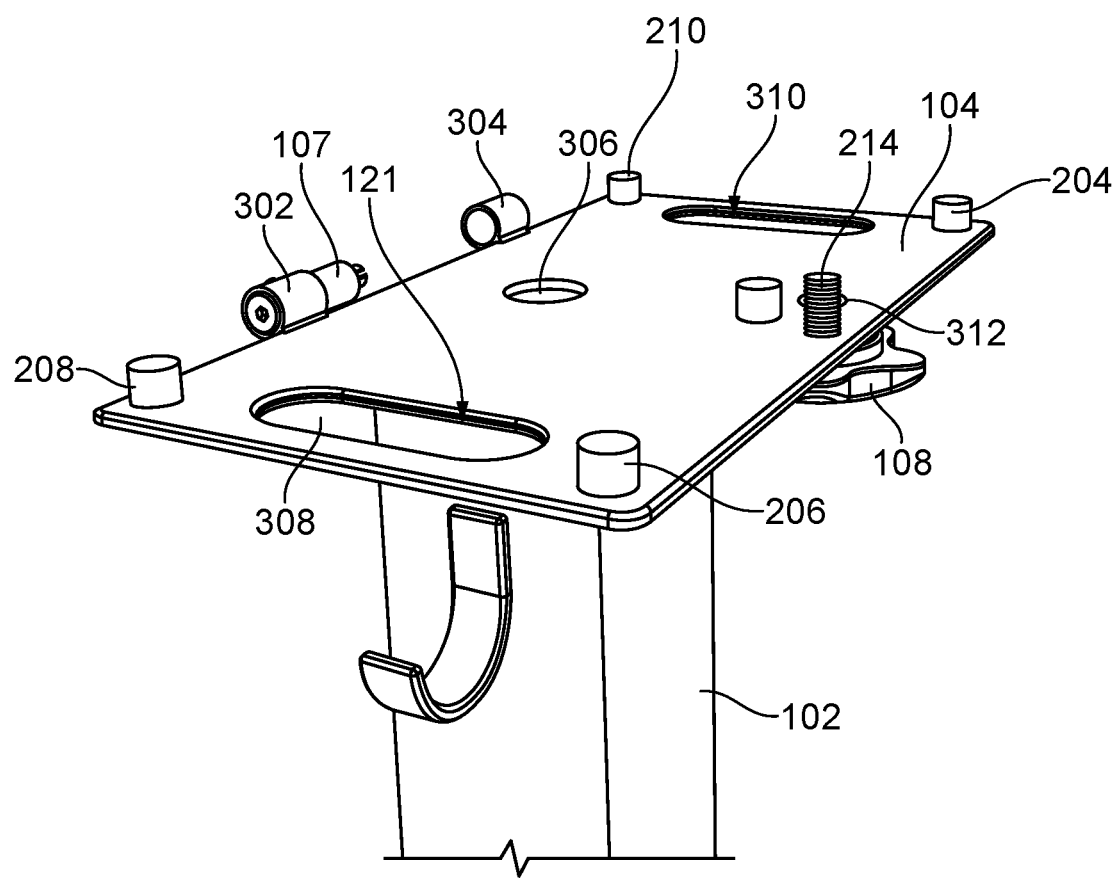
FIG. 3 shows a perspective view of a bottom supporting plate affixed to a primary shaft of the flip top table in one embodiment of the present invention.

Referring now to FIG. 3, the bottom supporting plate 104 affixed to the primary shaft 102 in one embodiment is disclosed. In one embodiment, the bottom supporting plate 104 is secured to the primary shaft 102. The bottom supporting plate 104 further comprises hinge tubes (304 and 304) in order to receive the top supporting plate 106 along with the hinge assembly 107. In one embodiment, the bottom supporting plate 104 further comprises cutouts 306, 308 and 310 in the middle and on both sides for hand holds to facilitate moving of the flip top table 100. In one embodiment, the locking knob 108 with steel threads further comprises a clip 312, for example, an e-clip. In one embodiment, the clip 312 is secured to the threads 214 (shown in FIG. 15) to support and keep the bottom supporting plate 104 and the top supporting plate 106 in a secured parallel position when the assemble is in the closed or horizontal and locked position.

Figure 4:
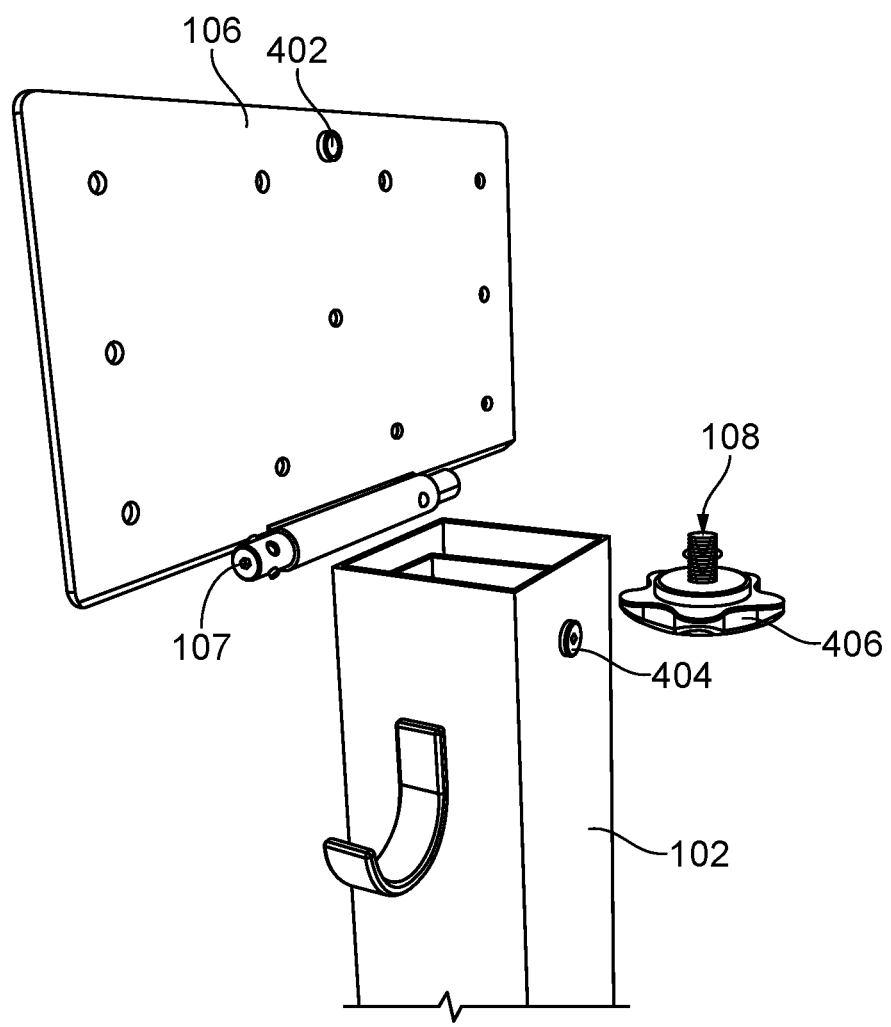
FIG. 4 shows a perspective view of a top supporting plate affixing to the primary shaft of the flip top table in one embodiment of the present invention.

Referring to FIG. 4, the top supporting plate 106 affixed to the primary shaft 102 in one embodiment is disclosed. In one embodiment, the top supporting plate 106 is affixed to the primary shaft 102 using the hinge assembly 107. In one embodiment, the locking knob 108 is secured to a bottom portion of the bottom supporting plate 104 in order to horizontally position the tabletop 118 using aperture 402. The shaft 102 comprises bore 404 which is configured for mating with the threaded portion of 406 of locking knob 108.

Figure 5:
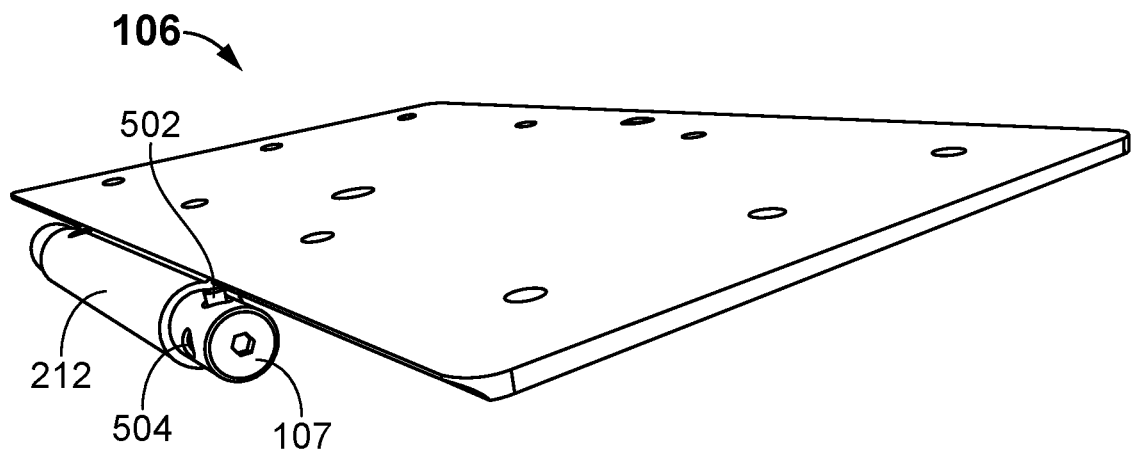
FIG. 5 shows a perspective view of the top supporting plate in one embodiment of the present invention.

Referring to FIG. 5, the top supporting plate 106 of the flip top table 100 is disclosed. In one embodiment, the top supporting plate 106 is configured to receive the tabletop 118. The tabletop 118 is secured to the top supporting plate 106 using one or more fasteners, for example, bolts and nuts. In one embodiment, the top supporting plate 106 further comprises a sheath 212 (or long bushing or a holder) for receiving the tension spring pivoting assembly or a hinge assembly 107. In one embodiment, sheath 212 is welded to one end of the top supporting plate 106. The hinge assembly comprises pivot pin 502 and hole 504 such during rotation, the pivot pins 502 are configured to provide precision locating function for the three steel bushings (302, 304, and 119) and provide a bearing surface for the rotation of the steel bushings. Further, the pivot pin 502 is configured to provide a secure slot for the capture of the internal spring or tension spring 602.

Figure 6:
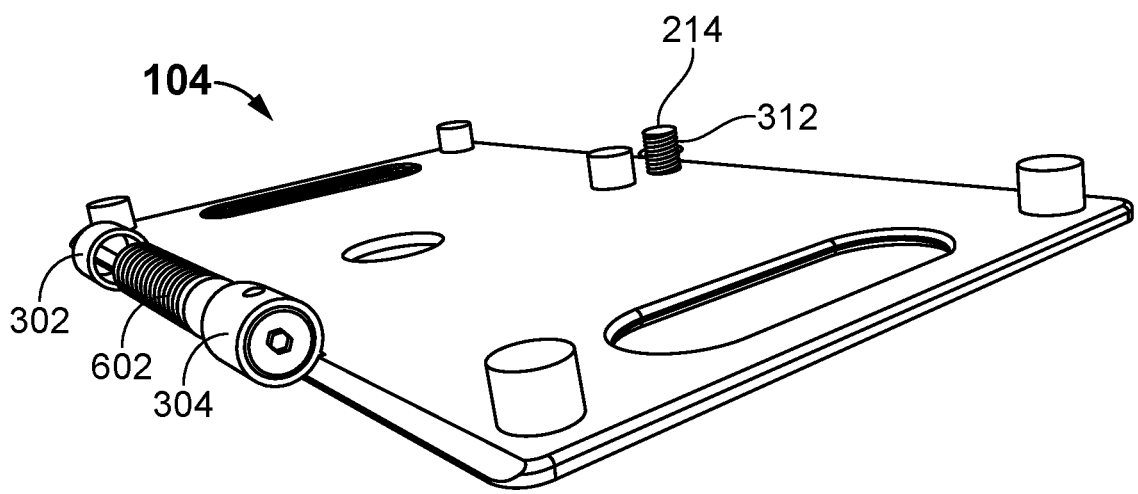
FIG. 6 shows a perspective view of the bottom supporting plate in one embodiment of the present invention.

Referring now to FIG. 6, the bottom supporting plate 104 of the flip top table 100 in one embodiment is disclosed. In one embodiment, the bottom supporting plate 104 having the hinge tubes 302 and 304 (which form part of the hinge sheath), which are secured or welded to one end of the bottom supporting plate 104 for receiving the hinge assembly 107. In one embodiment, the tension spring inside the hinge assembly hinge assembly 107 is provided with an internal spring 602 in order to exert force for holding the top supporting plate 106 in the open position or axially upward position.

Figure 7:
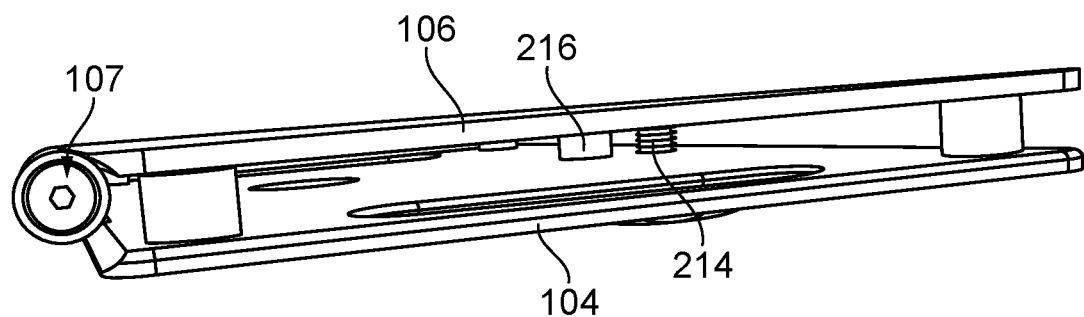
FIG. 7 shows a perspective view of the bottom supporting plate and the top supporting plate are in a closed or horizontal and locked position in one embodiment of the present invention.
Figure 8:
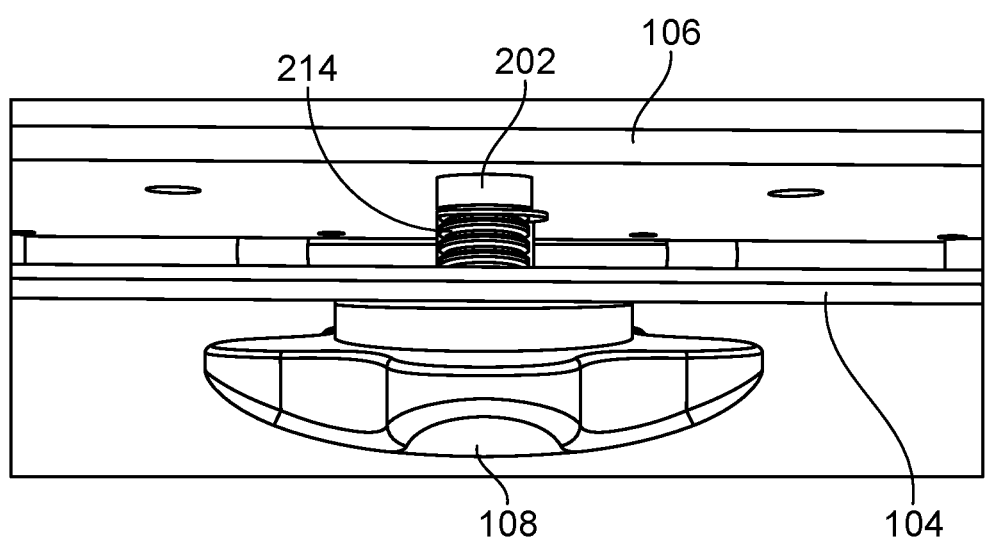
FIG. 8 shows a front view of the bottom supporting plate and the top supporting plate are in a closed or horizontal and locked position in one embodiment of the present invention.

Referring now to FIG. 7 and FIG. 8 together, the bottom supporting plate 104 and the top supporting plate 106 are shown in a closed or horizontal and locked position. In one embodiment, the locking knob 108 enables the user to lock both bottom supporting plate 104 and the top supporting plate 106 together in a secured parallel position. All tolerance should be kept to zero in this configuration. In one embodiment, the hinge assembly 107 tolerance is held to −0.005 to +0.005 for securing the bottom supporting plate 104 and the top supporting plate 106 together in the horizontal rotational plane. The tabletop 118 may not rotate in the horizontal plane or vertical plane, as this would be perceived by the user as being unstable. The user can lock and unlock the lock both bottom supporting plate 104 and the top supporting plate 106 together in a secured parallel position using the locking knob 108. The locking knob with steel threads 108 is able to apply necessary force to securely keep the bottom supporting plate 104 and the top supporting plate 106 together. The threaded insert or steel threaded bushing 202 may receive the steel threads 214 of the locking knob 108 in order to lock the top supporting plate 106 and the horizontal supporting plate 104 together in the horizontal or closed position.

Figure 9:
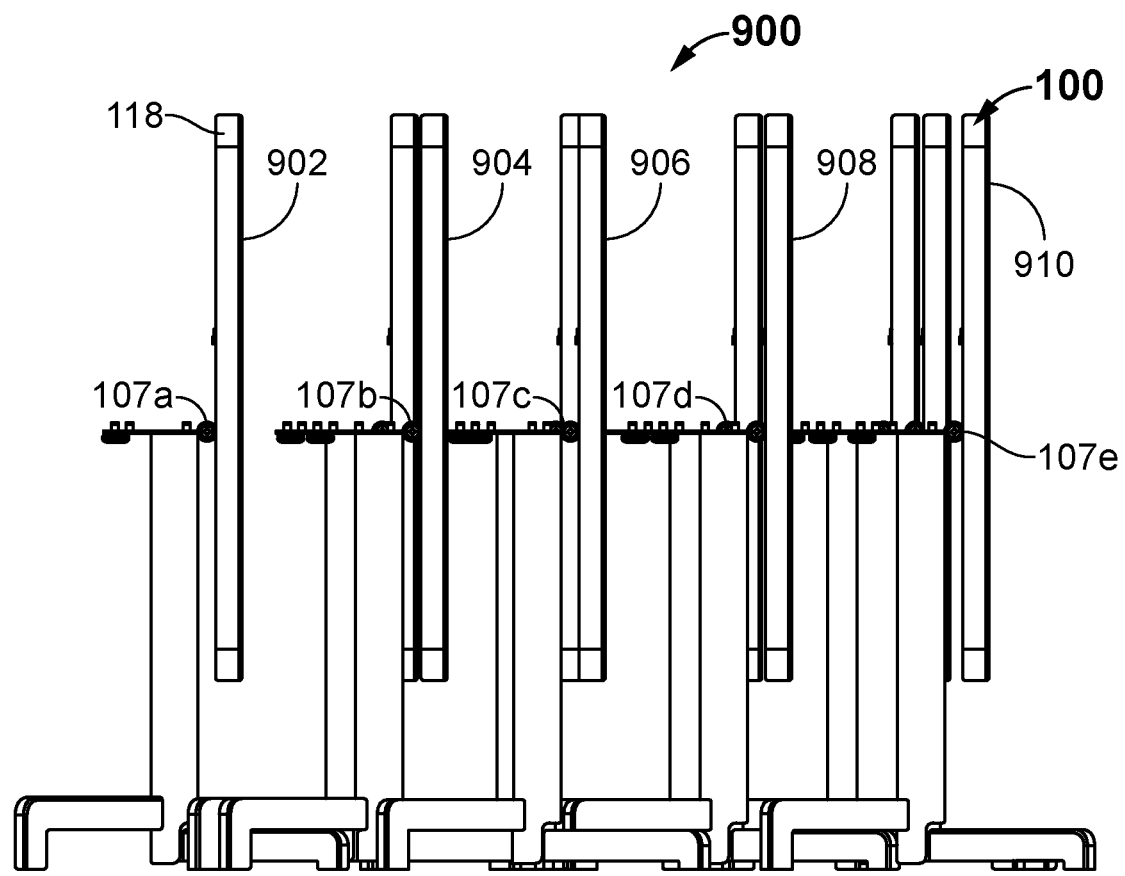
FIG. 9 shows a side view of tables stacked and nested within adjacent tables for storage in one embodiment of the present invention.

Referring now to FIG. 9, the flip top tables 100 are stacked and nested within adjacent tables for storage in one embodiment is shown generally at 900. In one embodiment, the flip top tables 100 are capable of nesting in a minimum length to conserve space and permit storage of a large number of tables in a given storage space. The user could easily deploy or position the tabletop 118 upwardly and store the flip top tables 100 in a nesting configuration. This eliminate the problems and risks associated with stacking of several tables 100. In one embodiment, the nesting position allows approximately 4×-6× tables per square feet. As can be seen, hinges 107a-107e is shown with tables 902, 906, 906, 908 and 910.

Figure 10:
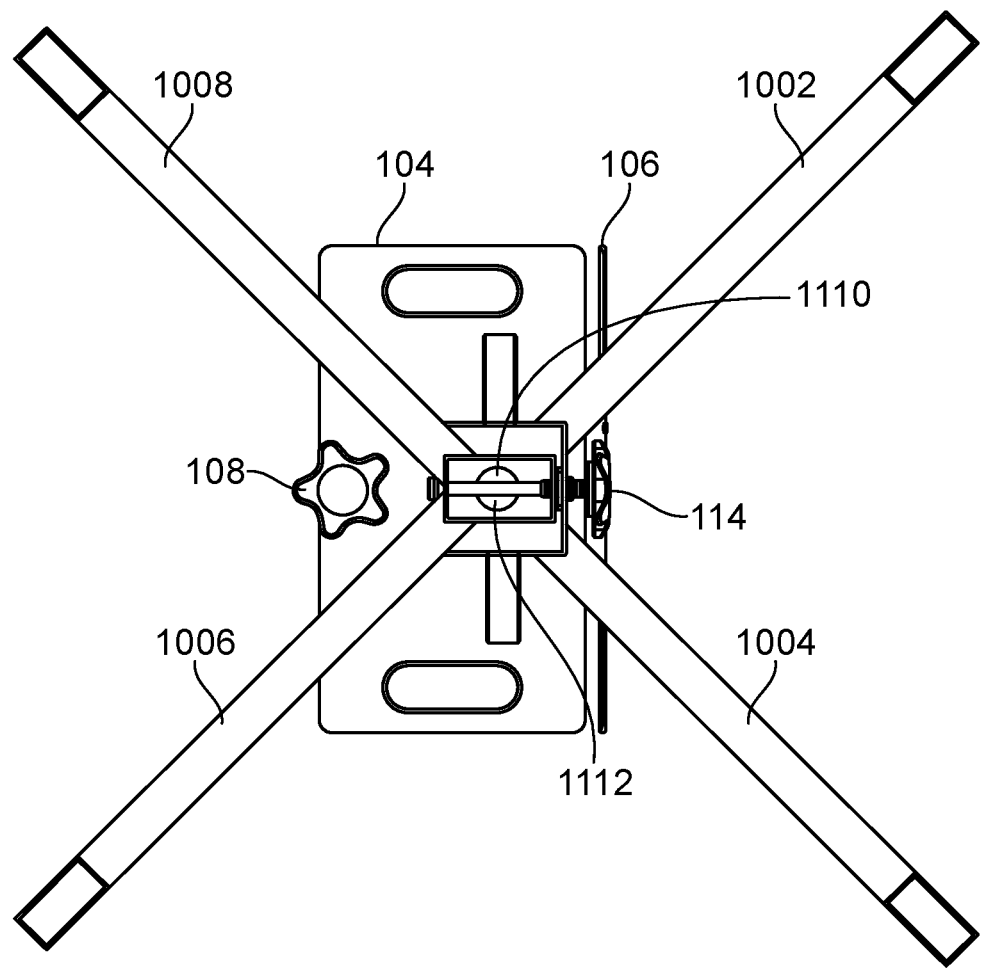
FIG. 10 shows a bottom view of the table with two pair of legs in another embodiment of the present invention.

Referring now to FIG. 10, a bottom view of the flip top table 100 in another embodiment is disclosed. In this, the flip top table 100 further comprises two pair of legs i.e., a first pair of legs 1002 and 1004 and a second pair of legs 1006 and 1008, which are adjustably and securely connected using the locking knob 114 with steel threads 1112. In one embodiment, the first pair of legs and second pair of legs could support the tabletop or top board 118 when it is used at a working position or a use position, and operates to self adjust on any level to keep the table from rocking before it is locked in (via use of a secondary shaft inside the primary shaft and connected to the first or second pair of legs, wherein the primary shaft is connected to the other of the pair of legs to pivot horizontally so that it comes to rest on an uneven surface, at which point it is locked in via lock 114. Further, the first pair of legs 1002 and 1004 and second pair of legs 1006 and 1008 have degrees of freedom of rotation motion so that the user can position adjacent legs in a nested arrangement in spaces that are difficult for storage, for example. In this way, the user can loosen the threads 1112 to allow rotation motion to ensure the legs of adjacent tables can nest against each other (e.g., 2-4 centimeters of rotational motion).

Figure 11:
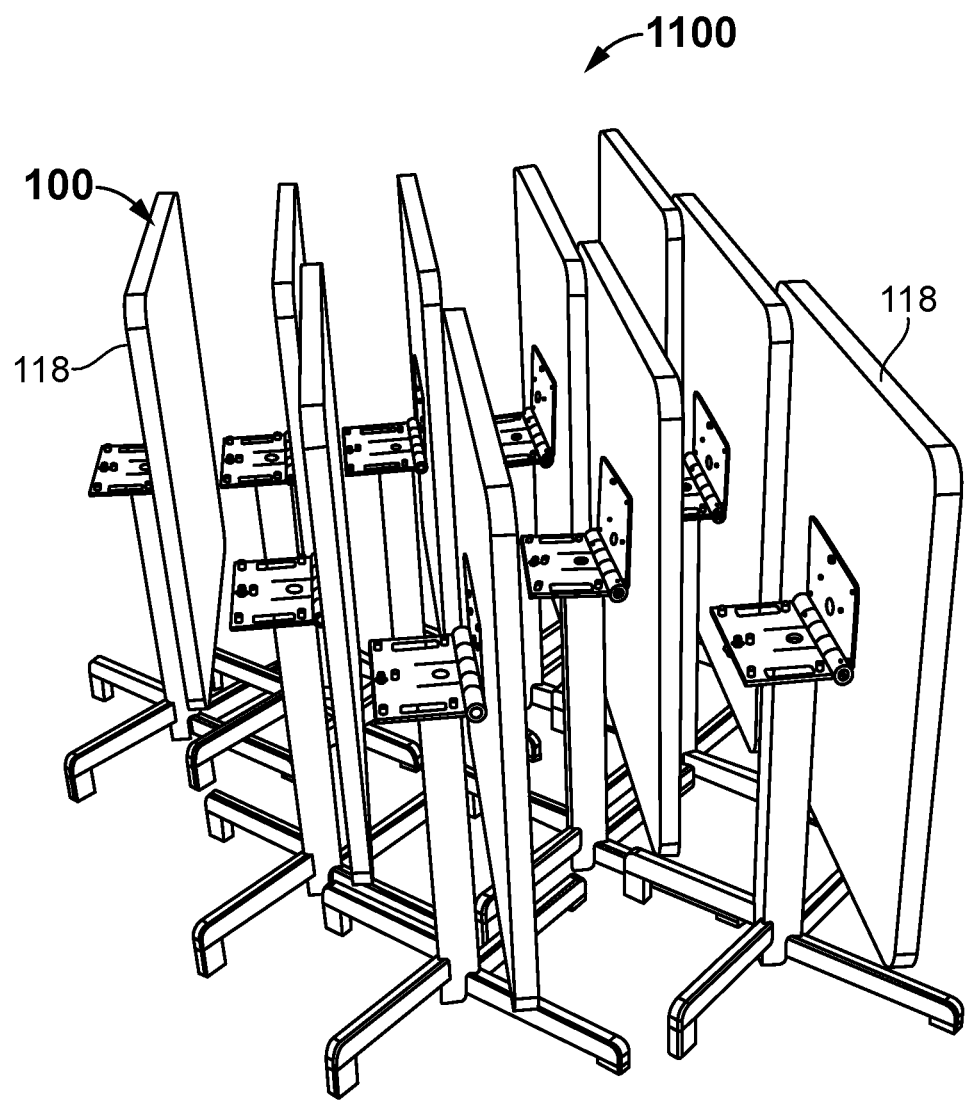
FIG. 11 shows a side view of tables stacked and nested within adjacent tables for storage in another embodiment of the present invention.

Referring to FIG. 11, the flip top tables 100 are in stacked and nested within adjacent tables for storage in another embodiment is disclosed at 1100. In this embodiment, a first pair of legs 1002 and 1004 and a second pair of legs 1006 and 1008 are configured to enable the user to position and store the flip top tables 100 in a nesting configuration within a minimum length to conserve space and permit storage of a large number of tables in a given storage space and are dimensioned so the legs of adjacent tables next together. In this way, the user easily deploy or position the tabletop 118 upwardly and store the flip top tables 100 in a nesting configuration as shown in FIG. 11.

Figure 12:
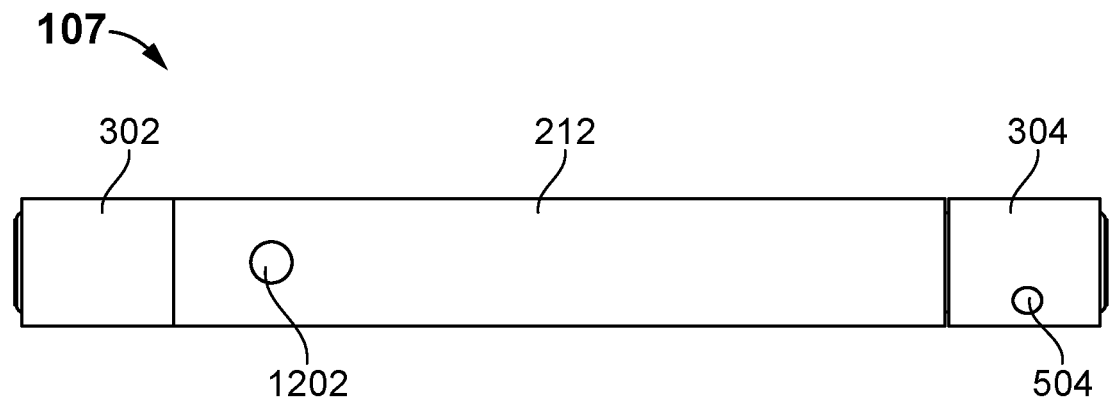
FIG. 12 shows a side view of a tension spring pivoting assembly or a flip mechanism or a hinge assembly of the flip top table in one embodiment of the present invention.

Referring to FIG. 12, the tension spring pivoting assemble or flip mechanism or hinge assembly 107 of the flip top table 100 in one embodiment is disclosed. In one embodiment, the hinge assembly 107 is configured to hingedly connect the top supporting plate 106 to the hinge tubes or steel bushings 302 and 304, which are connected or welded to one end of the bottom supporting plate 104, thereby selectively moving the tabletop 118 between a folded or horizontal position and an unfolded or vertical position. In one embodiment, the hinge assembly 107 further comprises a long bushing (pivot pin bosses) 119, which is attached or welded to the top supporting plate 106.

Figure 13:
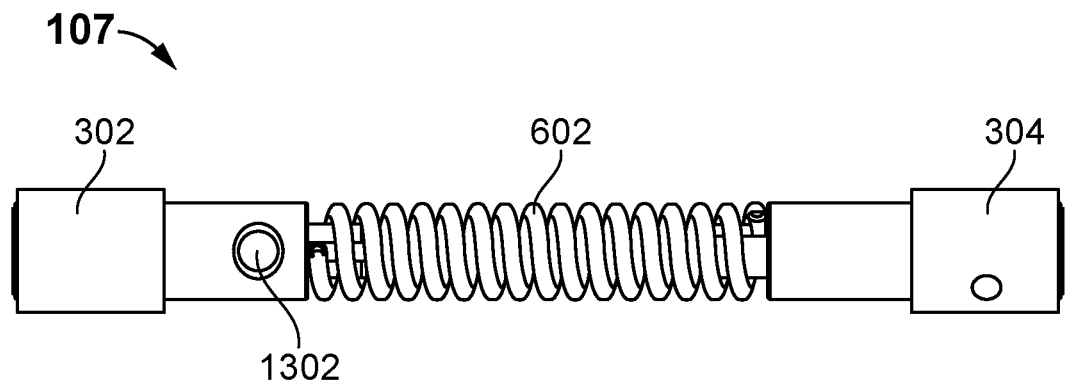
FIG. 13 shows an internal view of the tension spring pivoting assemble or a flip mechanism or a hinge assembly having an internal spring and pivot pins on both sides of the hinge assembly in one embodiment of the present invention.
Figure 14:
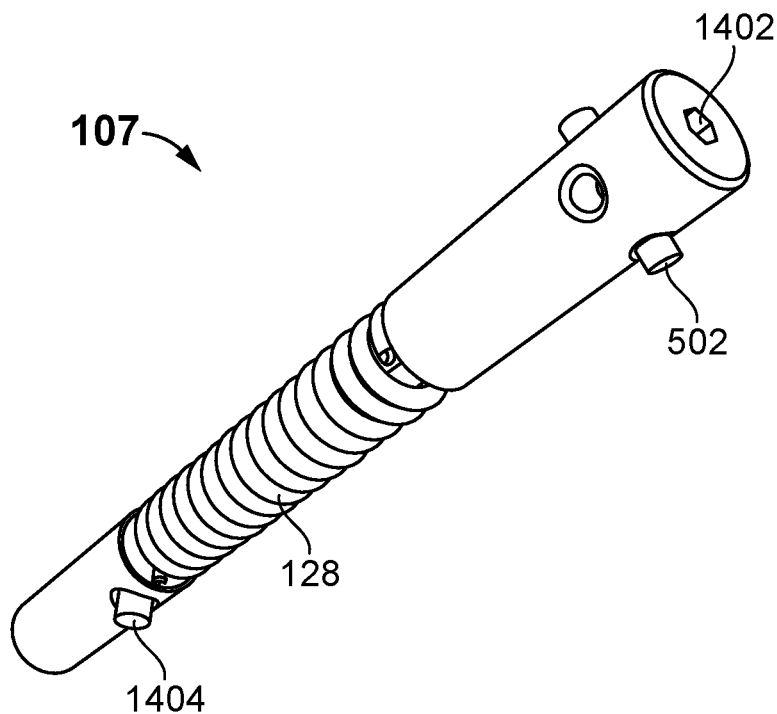
FIG. 14 shows another an internal view of the tension spring pivoting assemble or a flip mechanism or a hinge assembly having an internal spring and pivot pins on both sides of the hinge assembly in one embodiment of the present invention.

Referring to FIGS. 13 and 14, the internal spring 602 and pins 502 and 1404 on both sides of the hinge assembly 107 in one embodiment is disclosed. In one embodiment, the hinge assembly 107 is provided with the internal spring 602 and pins or pivot pins 502 and 1404 on both sides of the hinge assembly 107, and three steel bushings (302, 304, and 119). In one embodiment, the pivot pins 502 and 1404 are configured to provide precision locating function for the three steel bushings 302, 304, and 119 and provide a bearing surface for the rotation of the steel bushings. Further, the pivot pins 502 and 1404 are configured to provide a secure slot for the capture of the internal spring or tension spring 602. When the pivot pins 502 and 1404 are inserted into the bushings 304 and 119), the bottom and top supporting plates 104 and 106 can rotate independent of each other but maintain a precise relationship, whether in the open, vertical position, or closed in the horizontal position.

In one embodiment, the hinge assembly 107 further comprises at least two roll pins, which are configured to provide a simple method to lock the pivot pins 502 and 1404 position relative to the steel busing. The roll pin locks the steel pin in relation to the long bushing 119, which is attached to the top supporting plate 106. The second roll pin locks the other steel pin in relation to one of the short bushings, which is attached to the bottom supporting plate 104. This pin is also used to adjust the tension on the internal spring 602. In the end of the steel pin is a hex pattern to insert a tool to apply and adjust the tension on the internal spring 602. When the correct tension is obtained, by rotating the steel pin, the roll pin is inserted through matching holes in the bushing and steel pin to lock the steel pin in place.

The internal spring 602 exerts force for holding the top supporting plate 106 in the open position or upward axially position. When the top supporting plate 106 attached to the tabletop 118, it will move from the open or vertical position to the horizontal or closed position where the internal spring 602 is put under tension. The loading of the internal spring 602 provides a countering force to the closing force or weight of the tabletop 118. This force aids to reduce the quick and uncontrolled closing of the tabletop assemble. In one embodiment, the user could adjust the force and load the rotating spring force for the opening force using a hex key via hex key openings 134 at both ends, thereby counteracting closing weight of the tabletop 118.

Figure 15:
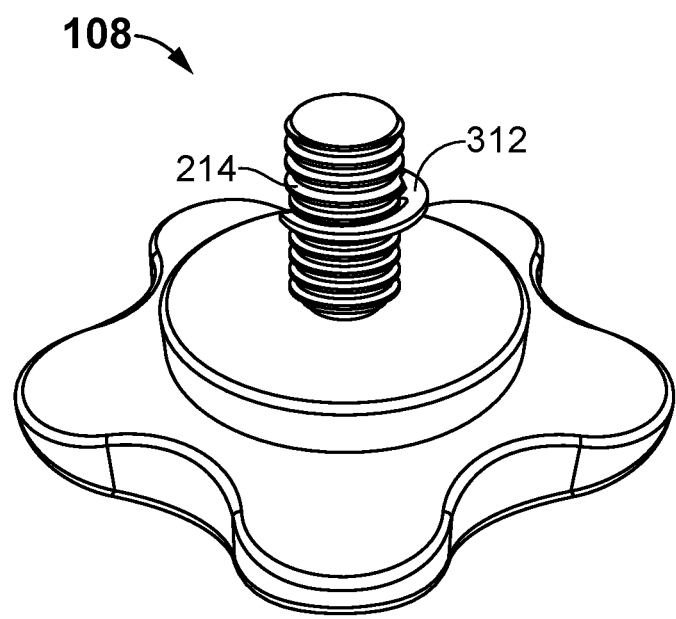
FIG. 15 shows a perspective view of a locking knob with threads in one embodiment of the present invention.

Referring to FIG. 15, the locking knob 108 with steel threads 214 in one embodiment is disclosed. In one embodiment, the locking knob 108 is operatively positioned at a bottom portion of one end of the bottom supporting plate 104. In one embodiment, the locking knob 108 at the bottom portion is configured to secure the top supporting plate 106 for horizontally positioning the tabletop 118, thereby supporting user items such as, but not limited to, a laptop, a computer, writing and/or drawing equipment, food, beverages, and so forth.

The locking knob 108 provides a clamping force that holds the top supporting plate 106 and the bottom supporting plate 104 in a closed or horizontal position. The locking knob 108 has a male thread and is inserted through a hole in the bottom supporting plate 104. The steel threaded insert or bushing 202 (shown in FIG. 2) has female threads and is attached (welded) to the top supporting plate 106. When the top supporting plate 106 is closed, the locking knob's male thread 214 is inserted into the female thread of the steel threaded insert or bushing 202 and the locking knob 108 is turned and the resulting clamping force is applied, and the bottom and top supporting plates (104 and 106) are held in a secure position.

In one embodiment, the clip 310, for example, E-clip, is secured to the threads 214 to support and keep the bottom supporting plate 104 and the top supporting plate 106 in a secured parallel position when the assemble is in the closed or horizontal and locked position. The clip 310, when inserted in a groove in the male threads of the locking knob 108, ensures that the locking knob will not fall out of its hole in the bottom supporting plate 104. The hole in the bottom supporting plate 104 is larger than the diameter of the male threads and does not have a female thread. Thus, the locking knob 108 is free to turn in the bottom supporting plate 104. In one embodiment, the clip 310 is a made of, but not limited to, spring steel and snaps into the groove in the male threads. The inside dimension of the clip is smaller than the outside diameter of the groove. This provides for a resistance fit, so that the clip 310 will stay in place.

In one embodiment, when attached to a table base, the flip top table 100 allows for the 90+ degrees rotation of the attached tabletop 118, along with the offset nesting leg configuration for facilitating the closer storage of multiple table bases with attached tabletops as shown in FIGS. 9 and 11. The tension spring pivoting assemble 107 and offset mounting of the flip top table 100 helps maintain the tabletop 118 in the vertical plane and assists in the smooth and safe transition to the horizontal plane. The flip mechanism and nesting leg configuration together allow for the storage of four to six times more table bases in the same space, compared to a standard table base tabletop configuration. The tension spring allows for a very simple means of controlling the tabletop 118 in the correct position for storage and the safe transition to the horizontal position. In one embodiment, the flip top table 100 could be used on a table base without the use of the nesting legs.

Preferred embodiments of this invention are described herein, including the best mode known to the inventors for carrying out the invention. It should be understood that the illustrated embodiments are exemplary only and should not be taken as limiting the scope of the invention.

The foregoing description comprise illustrative embodiments of the present invention. Having thus described exemplary embodiments of the present invention, it should be noted by those skilled in the art that the within disclosures are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one skilled in the art to which this invention pertains having the benefit of the teachings in the foregoing descriptions. Although specific terms may be employed herein, they are used only in generic and descriptive sense and not for purposes of limitation. Accordingly, the present invention is not limited to the specific embodiments illustrated herein.

What is claimed is:
1. A flip top table comprising:
a primary shaft having a top portion;
a bottom supporting plate secured to the top portion of the primary shaft;
a hinge assembly connected to a side of the bottom supporting plate, wherein the hinge assembly comprises pivot pins such that during rotation, the pivot pins are configured to provide a locating function for at least one bushing and further provide a bearing surface for the rotation of the bushings, wherein the hinge assembly is further configured to provide a secure slot for a capture of an internal spring or a tension spring;
a top supporting plate coupled to the bottom supporting plate via the hinge assembly, wherein the top supporting plate is configured to receive and secure a tabletop;
a locking knob operatively positioned at a bottom portion of the bottom supporting plate, wherein the locking knob has a threaded portion that is configured to secure the bottom supporting plate to the top supporting plate, wherein a counter force from the hinge assembly is configured to dampen a closing weight of the top supporting plate;
a nesting leg assembly securely affixed to a bottom portion of the primary shaft, wherein the nesting leg assembly comprises a pair of nesting legs configured to enable a user to deploy or position the tabletop upwardly and store the tables in a nesting configuration;

wherein the top supporting plate comprises an insert configured to receive the threads of the locking knob to lock the top supporting plate to the bottom supporting plate in a horizontal position.

2. The flip top table of claim 1, wherein the hinge assembly comprises hinge tubes configured to hingedly connect the top supporting plate to the bottom supporting plate to selectively move the tabletop between the horizontal position and a vertical position.

3. The flip top of claim 1, wherein the hinge assembly further comprises a hinge sheath attached to the top supporting plate.

4. The flip top table of claim 1, further comprising a plurality of spacers attached to the top supporting plate or bottom supporting plate, wherein the plurality of spacers are configured to provide separation between the top supporting plate and the bottom supporting plate when the top supporting plate is in the horizontal position.

5. The flip top table of claim 1, wherein the locking knob comprises a clip to secure the threads and keep the bottom supporting plate and the top supporting plate in a secured parallel position.

6. The flip top table of claim 5, wherein the clip is an e-clip configured to support and keep the bottom supporting plate and the top support plate in a secured parallel position when the hinge assembly is in the closed or horizontal and locked position.

7. The flip top table of claim 1, wherein the hinge assembly comprises at least two roll pins configured to lock the pivot pins in a position relative to a steel bushing.

8. The flip top table of claim 7, wherein the at least two roll pins comprise a first roll pin configured to lock the pivot pin in relation to the bushing and a second roll pin configured to lock the other pivot pin in relation to another bushing which is attached to the bottom supporting plate, wherein the roll pin is configured to adjust the tension on the spring.

9. The flip top table of claim 1, wherein the pair of nesting legs comprises a first pair of legs and a second pair of legs, each of which are adjustably and securely connected using an additional locking knob.

10. The flip top table of claim 9, wherein the first pair of legs and the second pair of legs are adjustable rotationally by a user to ensure the legs of adjacent tables can nest against each other.

11. The flip top table of claim 10, further comprising a second lock knob configured to lock the second pair of legs into position.

12. The flip top table of claim 1, wherein the locking knob provides a clamping force that holds the top supporting plate and the bottom supporting plate in a closed or horizontal position.

13. The flip top table of claim 1, wherein when the insert receives the threads of the locking knob, and force is applied to the locking knob, the bottom and top supporting plates are held in a secure position.

14. The flip top table of claim 1, wherein the hinge assembly allows for at least ninety degrees of rotation.

* * * * *